United States Patent [19]

Ooms et al.

[11] Patent Number: 5,039,881
[45] Date of Patent: Aug. 13, 1991

[54] HIGH SPEED, LOW POWER INPUT BUFFER

[75] Inventors: William J. Ooms; Jerald A. Hallmark, both of Chandler, Ariz.

[73] Assignee: Motorola, Inc., Schaumburg, Ill.

[21] Appl. No.: 370,657

[22] Filed: Jun. 23, 1989

[51] Int. Cl.⁵ .................................... H03K 19/013
[52] U.S. Cl. ................................... 307/443; 307/455; 307/542; 307/475; 307/363
[58] Field of Search ............... 307/355, 362, 363, 443, 307/454, 455, 542, 475

[56] References Cited

U.S. PATENT DOCUMENTS

| | | | |
|---|---|---|---|
| 3,353,106 | 11/1967 | Dudek et al. | 307/542 |
| 4,297,593 | 10/1981 | Allen | 307/542 |
| 4,453,095 | 6/1984 | Wrathall | 307/446 |
| 4,518,876 | 5/1985 | Constantinescu | 307/455 |
| 4,533,842 | 8/1985 | Yang et al. | 307/455 |
| 4,647,799 | 3/1987 | Hsu et al. | 307/455 |
| 4,654,549 | 3/1987 | Hannington | 307/443 |
| 4,678,944 | 7/1987 | Williams | 307/475 |
| 4,698,527 | 10/1987 | Masumota | 307/455 |
| 4,727,271 | 2/1988 | Favata et al. | 307/542 |
| 4,749,951 | 6/1988 | Tanaka | 307/542 |
| 4,890,065 | 12/1989 | Laletin | 307/363 |

FOREIGN PATENT DOCUMENTS 0266218  5/1988  European Pat. Off. ............ 307/455
1403622  8/1975  United Kingdom ................ 307/455

OTHER PUBLICATIONS

Mukai et al, "Master Slice ECL LSI"9-73, p. 1339.

Primary Examiner—Stanley D. Miller
Assistant Examiner—Terry D. Cunningham
Attorney, Agent, or Firm—Juliana Agon

[57] ABSTRACT

An input buffer includes an input circuit (80), a pair of complimentary outputs (52,54) and a differential ampliifer (12). The input buffer includes a pull-down diode (90) arranged in parallel with pull-up diodes (84, 86, and 88), coupled between the buffer input (82) and the differential amplifier input (32). Pull-up is achieved through the low impedance path of the pull-up diodes, eliminating a need for a high value resistor. Pull-down is achieved through the pull-down diode in series with a resistor (92). This arrangement provides high speed of operation, while reducing current consumption.

8 Claims, 1 Drawing Sheet

HIGH SPEED, LOW POWER INPUT BUFFER

TECHNICAL FIELD

This invention relates generally to input buffers, and more specifically, to those input buffers that require high speed operation, while consuming very low power.

BACKGROUND OF THE INVENTION

Input buffers that convert a conventional 5 volt swing to differential Diode Load Emitter Coupled Logic (ECL) levels are known. One known input buffer is illustrated in FIG. 1. The input buffer includes an input circuit 10, a differential amplifier 12, and a bias circuit 14. The input circuit includes a plurality of series coupled diodes 70, 72, and 74, which, when implemented on an integrated circuit (IC), are formed by bipolar transistors having their collector and base terminals coupled together. The first transistor (diode) 70 has its collector and base coupled to a $V_{CC}$ bias source, and its emitter coupled to the collector and base of transistor (diode) 72, which is similarly coupled to transistor 74. A resistor 76, which is typically a high valued resistor having a large area on the integrated circuit, is coupled between the emitter of transistor (diode) 74 and the base and collector of a transistor 78, which is also connected as a diode. The logic input to the buffer is applied at an input 30 and coupled to the emitter of transistor (diode) 78. An input 32, of the differential amplifier 12, is also coupled to the junction of resistor 76 and diode 78. It will be understood that when the input signal at the buffer input 30 is high, a high input is applied at the differential amplifier's input 32, and when the input signal at input 30 is low, a low input is applied to input 32. During the time that the input 30 is low, current will flow through the diodes 70, 72, and 74, resistor 76, and diode 78. The circuit, therefore, continually draws current while at a low input state. This, of course, is wasteful use of power.

The differential amplifier input 32 is applied to the base of a first differential transistor 34. Its emitter is coupled to an emitter of a second differential transistor 36, both of which are coupled to the collector of a transistor 38, which serves as a current source with its emitter coupled to ground. A plurality of transistors 40, 42, and 44 are coupled as series coupled diodes between the $V_{CC}$ supply and the collector of transistor 34, while a similar series of transistors 46, 48 and 50, also coupled as diodes, are coupled between the $V_{CC}$ supply and the collector of a transistor 36. An output 52 of the buffer, is provided by a connection to the collector of the transistor 36, while an inverted output 54 is provided by a connection to the collector of the transistor 34. The bias circuit 14 includes a resistor 56 coupled between $V_{CC}$ and the base of a transistor 36. Two transistors 58 and 60 are series coupled as diodes between the junction of resistor 56 and transistor 36, and ground. The junction of diodes, 58 and 60 is coupled to the base of transistor 38 to control the current through the transistor 38.

In operation, when a low signal is applied to the input 30, the base of transistor 34 is pulled low and the transistor 34 is turned off, which produces a high output at the inverter output 54. Conversely, when the transistor 36 is turned on, a low output is provided at the buffer output 52. When a high input signal is applied to the input 30, the transistor 34 is turned on causing transistor 36 to switch off, which provides a high output signal at buffer output 52, and low output signal at inverter buffer output 54.

Accordingly, since the input buffer wastes power when receiving a logic low, a need exists for an input buffer that minimizes this waste in power, while maintaining a high speed of operation.

SUMMARY OF THE INVENTION

Accordingly, it is an object of the present invention to provide an input buffer that overcomes the detriments of the prior art.

Briefly, according to the invention, an input buffer, comprises a buffer input circuit, and a differential amplifier having the complimentary outputs. The buffer input circuit has two diode paths (loads) coupled between an input port and the differential amplifier. One path (load) provides a logic high signal to the differential amplifier from the input port. Conversely, the other diode path (load) provides a logic low signal to the differential amplifier. Little power is wasted in the paths between the input port and the differential amplifier, thus reducing the power requirement of the input buffer.

DETAILED DESCRIPTION OF THE PREFERRED EMBODIMENT

Figure 1:
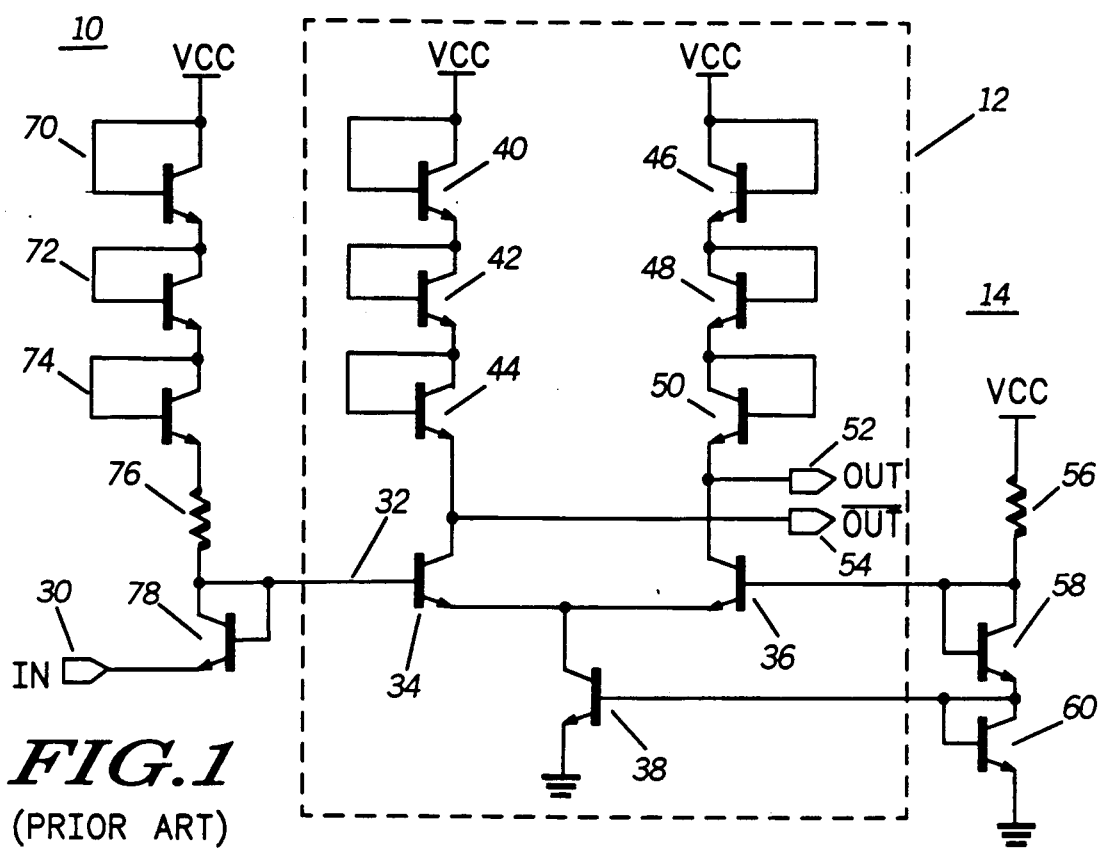
FIG. 1 is a schematic diagram of a conventional input buffer.
Figure 2:
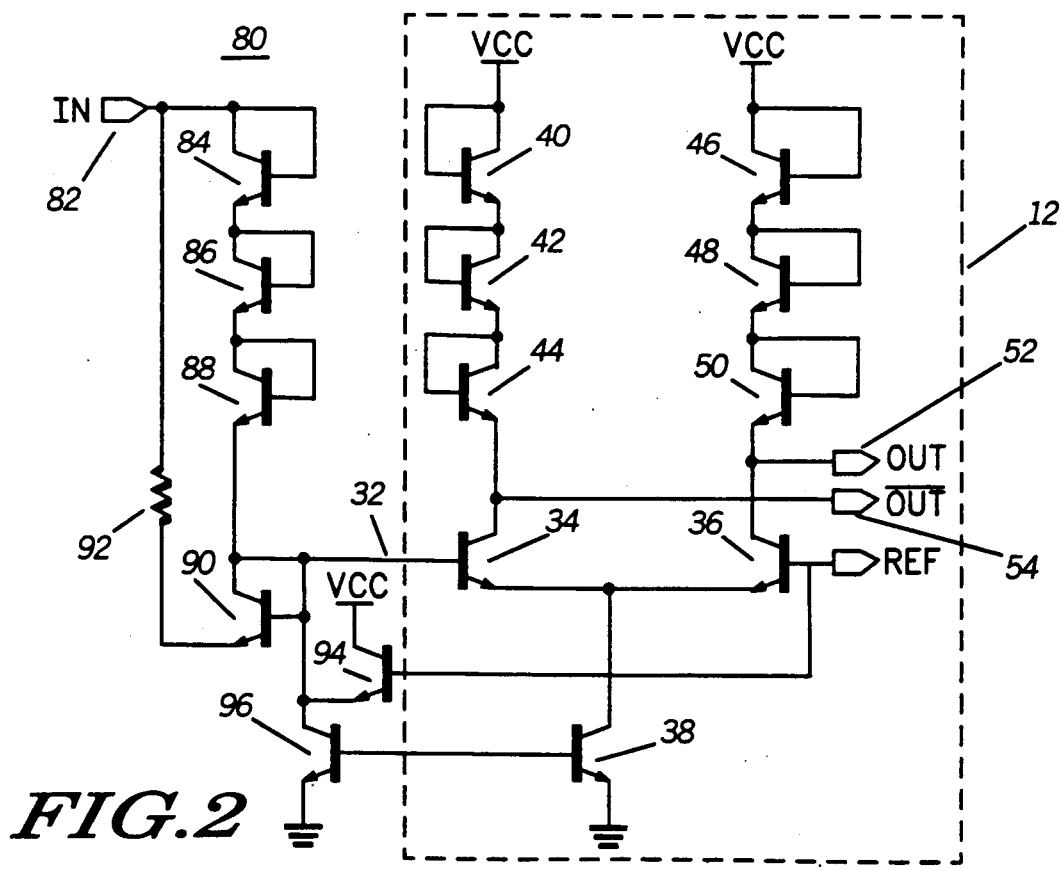
FIG. 2 is a schematic diagram of an input buffer in accordance with the present invention.

Referring to FIG. 2, an input buffer in accordance with the present invention is illustrated. The input buffer includes an input circuit 80 that is coupled to a differential amplifier (which is preferably of the same type as illustrated in FIG. 1). The bias circuit 14, (not illustrated in FIG. 2) is also preferably utilized to provide bias voltages to the transistors 36 and 38.

The input circuit 80 includes a buffer input 82 that is coupled to a series of transistors 84, 86, and 88 coupled as diodes. Diode 84 has its anode coupled to input 82, and the diode 88 has its cathode coupled to the input 32 of the differential amplifier 12. A transistor 90, also coupled as a diode, has its collector and base coupled to the input 32 of the differential amplifier 12, and its emitter is coupled via a resistor 92 to the buffer input 82.

In operation, when a logic high input signal is applied at input 82, a logic high signal is applied via diodes, 84, 86, and 88 to the input 32 of the differential amplifier 12. When the input signal at input 82 is a logic low, a low signal is coupled via resistor 92 and diode 90 to the logic input 32. The input circuit 80 thereby actuates the differential amplifier 12 to provide the desired ECL level signals 52 and inverted output 54.

A current source comprising transistor 96 is coupled to input 32 of differential amplifier 12. A transistor 96 has its base biased by the same bias signal applied to the transistor 38. This current source improves the operating speed of input buffer 80 by providing a pull-down on the base of the transistor 34. A transistor 94 has its emitter coupled to the input 32, its collector coupled to the $V_{CC}$ supply, and its base coupled to the same bias voltage as the base of transistor 36. This transistor provides a clamping means for limiting the voltage excursion of the differential amplifier. This is accomplished by preventing saturation of transistor 96 when the input signal at input 82 is low.

It will be appreciated that unlike the prior art input buffer of FIG. 1, when the input signal at input 82 is a logic low, there is no current being drawn through the input circuit 80 as occurs in the input buffer of FIG. 1. Thus, high speed operation is maintained, while eliminating wasted energy.

What is claimed is:

1. An input buffer comprising:
   a buffer input,
   a pair of complementary outputs,
   a differential amplifier having an input and providing said complementary outputs,
   first diode means coupled between the buffer input and the differential amplifier input for providing a logic high input signal to the differential amplifier when the buffer input is logic high and,
   second diode means coupled between the buffer input and the differential amplifier input for providing a logic low input signal to the differential amplifier without consuming current in the first diode means when the buffer input is logic low, and
   a current source coupled between the differential amplifier input and ground.

2. An input buffer according to claim 1, wherein:
   said first diode means includes at least one diode having its anode operatively coupled to the buffer input and its cathode operatively coupled to the differential amplifier input.

3. An input buffer according to claim 1, wherein:
   said first diode means includes a plurality of diodes serially coupled anode to cathode.

4. An input buffer according to claim 1, wherein:
   said second diode means includes a diode having its cathode operatively coupled to the buffer input and its anode operatively coupled to the differential amplifier input.

5. An input buffer according to claim 4, wherein:
   a resistor is coupled between said buffer input and said cathode of the second diode means.

6. An input buffer according to claim 1, wherein said current source and said second diode means both conduct current from said differential amplifier input when the buffer input is logic low.

7. An input buffer according to claim 1, wherein:
   a clamping means is operatively coupled to the differential amplifier input for limiting the voltage excursion of the differential amplifier.

8. The input buffer according to claim 7 wherein said clamping means comprises a transistor having its emitter operatively coupled to the differential amplifier input, its collector operatively coupled to a supply, and its base operatively coupled to a bias voltage.

* * * * *